United States Patent [19]

Haitz

[11] Patent Number: 5,134,340
[45] Date of Patent: Jul. 28, 1992

[54] LIGHT-EMITTING DIODE PRINTHEAD
[75] Inventor: Roland H. Haitz, Portola Valley, Calif.
[73] Assignee: Hewlett-Packard Company, Palo Alto, Calif.
[21] Appl. No.: 667,237
[22] Filed: Mar. 8, 1991

Related U.S. Application Data

[63] Continuation of Ser. No. 427,191, Oct. 26, 1989, abandoned.
[51] Int. Cl.⁵ .................... H01L 27/15; H01L 33/00; G01D 9/42
[52] U.S. Cl. ................... 313/500; 346/107 R; 313/36; 357/17; 437/205
[58] Field of Search ............ 313/35, 36, 500; 346/107 R; 357/17, 45; 437/205; 228/123

[56] References Cited

U.S. PATENT DOCUMENTS

| | | | |
|---|---|---|---|
| 3,932,226 | 1/1976 | Klatskin et al. | 437/205 |
| 4,268,348 | 5/1981 | Allison et al. | 437/205 |
| 4,435,064 | 3/1984 | Tsukada et al. | 355/1 |
| 4,605,944 | 8/1986 | Ishii et al. | 357/17 |
| 4,749,120 | 6/1988 | Hatada | 228/123 |
| 4,820,013 | 4/1989 | Fuse | 350/96.27 |
| 4,875,057 | 10/1989 | Hediger et al. | 346/107 R |
| 4,916,464 | 4/1990 | Ito et al. | 346/107 |
| 4,942,405 | 7/1990 | Dody et al. | 346/107 R |
| 4,947,195 | 8/1990 | Flynn et al. | 346/155 |
| 4,951,098 | 8/1990 | Albergo et al. | 346/107 R X |

FOREIGN PATENT DOCUMENTS

59-164161 1/1985 Japan .
63-112172 5/1989 Japan .

OTHER PUBLICATIONS

Xerox Disclosure Journal, vol. 10, No. 6, Dec. 1985, pp. 313-320, "High Resolution, High Frequency Infrared LED Printing Array and Fabrication Method".
Hatada, et al., A New LSI Bonding Technology "Micron Bump Bonding Assembly Technology", 1988, pp. 23-27.
Hatada, et al., A New LSI Bonding Technology "Micron Bump Bonding Technology", 1989, pp. 45-49.
Hatada, et al., Applications of New Assembly Method, "Micron Bump Bonding Method", 1989, pp. 45-48, IEEE/CHMT '89 Japan IEMT Symposium.
Hatada, et al., LED Array Modules by New Method Micron Bump Bonding Method 1989 IEEE, pp. 230-233, IEEE/CHMT '89 IEMT Symposium.
Seventh IEEE/CHMT International Electronic Manufacturing Technology Symposium—"Integration of the Manufacturing Flow—From Raw Material Through Systems-Level Assembly", Sep. 25-27, 1989, San Francisco, CA pp. 245-248.
Hatada, et al.—New-Film-Carrier-Assembly Technology—"Transferred Bump Tab", 1988 IEEE, pp. 122 to 127.
Hatada, et al., Application to the Electronic Instrument by Transferred Bump-Tab Technology, 1987 IEEE, pp. 81 to 86.
"LED Array Modules by New Technology Microbump bonding Method", IEEE Transactions on Components, Hybrids, and Manufacturing Technology, vol. 13, No. 3, Sep. 1990, by Kenzo Hatada, Hiroaki Fujimoto, Takao Ochi, and Yoichiro Ishida.

*Primary Examiner*—Donald J. Yusko
*Assistant Examiner*—Brian Zimmerman

[57] ABSTRACT

A printhead for a light emitting diode printer has a transparent substrate with a row of LED dice mounted on the substrate with their light emitting junctions adjacent to the substrate so as to emit light through the substrate. Each die has a row of LEDs along its length and a row of connection pads at known locations for making electrical connection to the LED anodes. Metal lines are deposited on the transparent substrate at known locations. Solder bumps between the connection pads and metal lines precisely position the dice by reason of surface tension. The dice are positioned in parallel rows with alternate dice staggered from each other for electrical isolation and to avoid mechanical interference at the ends of adjacent dice. In the event placement by way of the solder bumps is insufficiently precise, an opaque layer may be deposited on the substrate with a row of windows adjacent a row of LEDs. The windows are smaller than the LEDs so as to mask edge portions and alleviate alignment requirements.

18 Claims, 6 Drawing Sheets

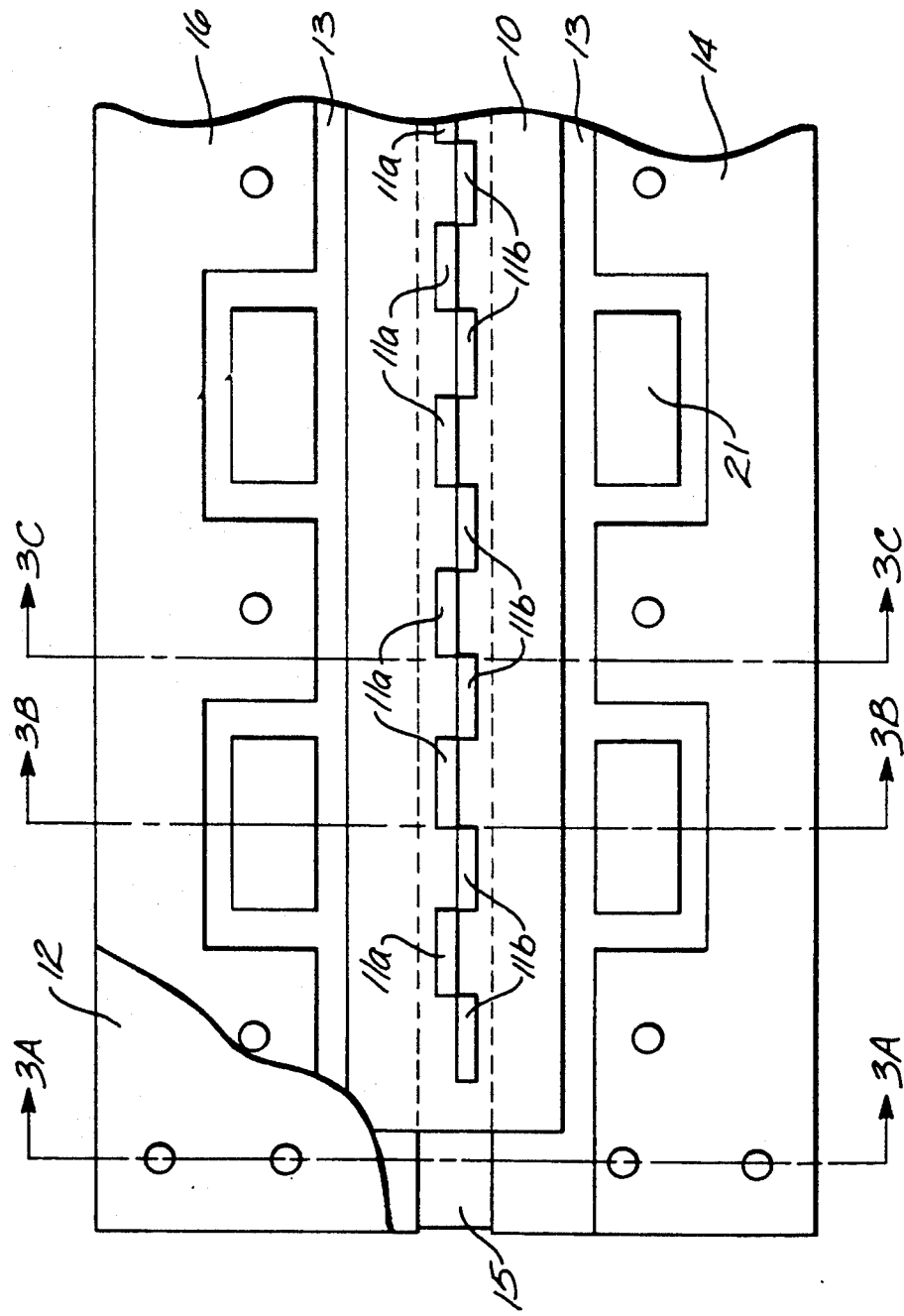

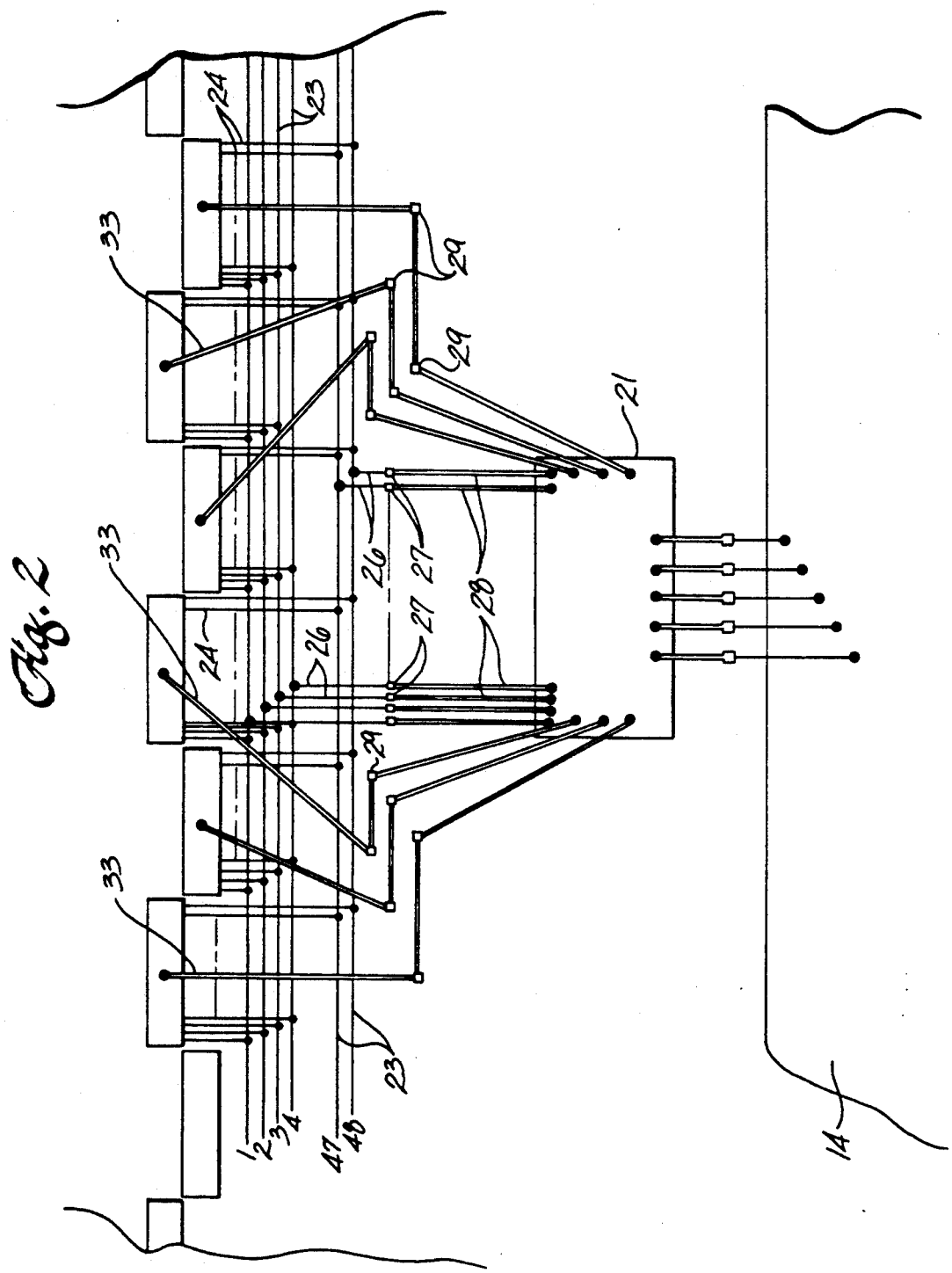

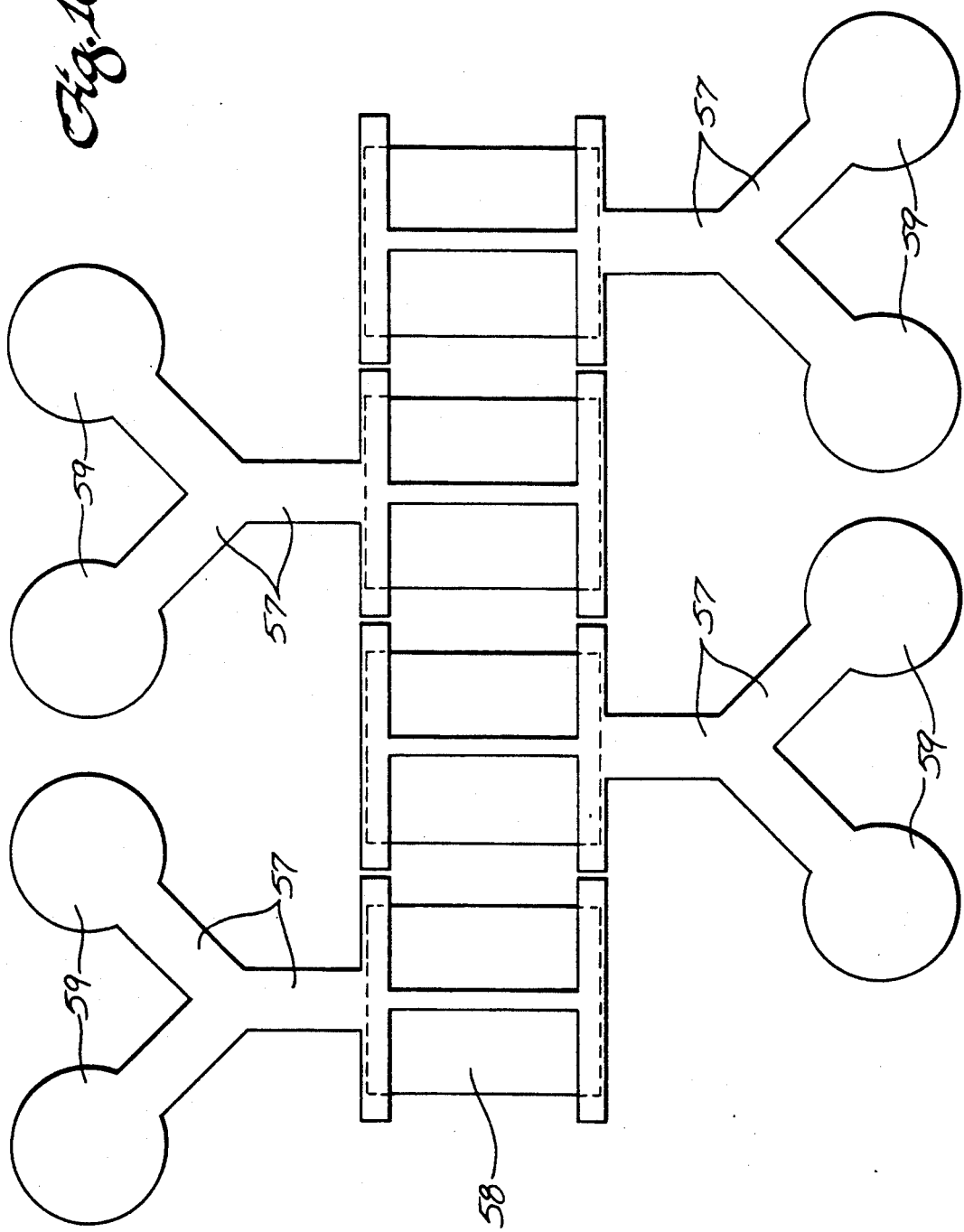

LIGHT-EMITTING DIODE PRINTHEAD

CROSS-REFERENCE TO RELATED APPLICATIONS

This is a continuation of application Ser. No. 07/427,191, filed Oct. 26, 1989 and abandoned.

BACKGROUND OF THE INVENTION

It has become desirable to employ xerographic non-impact printers for text and graphics. An electrostatic charge is developed on the photoreceptive surface of a moving drum or belt and selected areas of the surface are discharged by exposure to a light. A printing toner is applied to the drum and adheres to the areas having an electrostatic charge and does not adhere to the discharged areas. The toner is then transferred to a sheet of plain paper and is heat fused to the paper. By controlling the areas illuminated and the areas not illuminated, characters, lines and other images may be produced on the paper.

One type of non-impact printer employs an array of light-emitting diodes (LEDs) for exposing the photoreceptive surface. A row or two closely spaced rows of minute LEDs are positioned near a lens so that their images are arrayed across the surface to be illuminated. The LEDs along the row are selectively activated to either emit light or not as the surface moves past, thereby exposing or not exposing the photoreceptive surface in a pattern corresponding to the LEDs activated.

To obtain good resolution and image quality in such a printer, the physical dimensions of the LEDs must be quite small and very tight position tolerances must be maintained. Dimensional tolerances are often no more than a few tens of micrometers.

The light emitting diodes for such a printer are formed on gallium arsenide chips or dice by conventional techniques. Arrays of LEDs are formed on a large wafer which is then carefully cut into individual dice, each elongated die having a row of LEDs along its length. An exemplary die about eight millimeters long may have 96 LEDs along its length, where a printhead has 300 pixels per inch (118 pixels per centimeter). LED printheads have been designed with as many as 600 pixels per inch (236 pixels per centimeter). In an exemplary embodiment it has been necessary to cut the length of such a die to plus or minus two micrometers and the width is cut to plus or minus five micrometers.

In addition to precise tolerances for cutting the dice, there are practical problems in arranging these LED bearing dice in a straight line with the necessary precision for good image quality. Also, spacing of the dice along the line is important for maintaining approximately the same spacing between LEDs at the ends of adjacent dice as there is between the LEDs on a die. Clearly economical as well as precise assembly techniques are important.

Further, once the LEDs are positioned, electrical contact must be made to each LED for application of current to cause illumination by the LED. The individual dice are typically mounted on a metal substrate which forms a common electrical contact for the cathodes of all of the LEDs on the die. A metal line for each LED is deposited on the front face of the die to carry current to the LED anode. Each line extends to an enlarged pad to which a metal wire is bonded. The wires lead to nearby integrated circuit chips which provide power for the LEDs and quite often additional functions for the printhead. Thus, in a typical printhead thousands of wire bonds may be required.

Thus, in addition to alleviating difficulties in precise positioning of the LEDs for a printhead, it would be desirable to reduce the number of wire bonds that need be made to the LED dice during assembly of an LED printhead.

BRIEF SUMMARY OF THE INVENTION

There is, therefore, provided in practice of this invention according to a presently preferred embodiment a light emitting diode printhead having a transparent substrate with a row of light emitting diode dice along the substrate with their light emitting junctions adjacent to the substrate for emitting light through the substrate. A plurality of metal lines are deposited on the substrate for making electrical connections to the light emitting diodes. There is an electrical connection pad for each light emitting diode in a known location on the die. A solder bump in a known location on a metal line interconnects each pad with a metal line for making electrical connections. The solder bumps have sufficiently small dimensions that surface tension of the solder positions the respective dice relative to the metal lines.

Since the metal lines and electrical connection pads can be formed on the substrate and dice by photolithography, they can be positioned with considerable precision. Surface tension forces by the solder can therefore be used to position the LED dice with precision without need for expensive jigs and fixtures or elaborate assembly techniques. Further, the number of wire bonds needed to each LED die can be significantly reduced.

If desired for enhancing precision of the position of the dice, the pitch of the connection pads on the dice may be made slightly different from the pitch of the connection pads on the metal lines. This enhances the forces applied to the die if it is asymmetrically located, thus tending to center the die in its desired location.

In the event positioning by way of solder bump surface tension is insufficiently accurate, a mask may be applied to the glass by photolithography and the LEDs positioned behind the mask. An opaque layer is deposited on at least a portion of the transparent substrate with a row of windows corresponding to the LEDs on a die, each window having a dimension less than the dimension of the corresponding LED. Misalignment of the LED behind the window up to half the difference in dimensions does not change the apparent location of the LEDs on the transparent substrate.

The precision required for cutting the LED dice may be alleviated by staggering the successive dice from each other along the length of the row to avoid electrical contact between the ends of adjacent dice. This results in two spaced apart rows of LEDs which are made functionally into a single row by the timing of electrical signals for activating the LEDs.

BRIEF DESCRIPTION OF THE DRAWINGS

These and other features and advantages of the present invention will be appreciated as the same becomes better understood by reference to the following detailed description when considered in connection with the accompanying drawings wherein:

FIG. 1 is a semi-schematic, partly cutaway view of one face of a light emitting diode printhead constructed according to principles of this invention, some features having been omitted for clarity;

FIG. 2 is a semi-schematic enlargement of a fragment of a printhead as illustrated in FIG. 1 with some of the omitted details included;

FIG. 10 is a fragmentary face view of another embodiment of LED die.

DETAILED DESCRIPTION

Figure 3A:
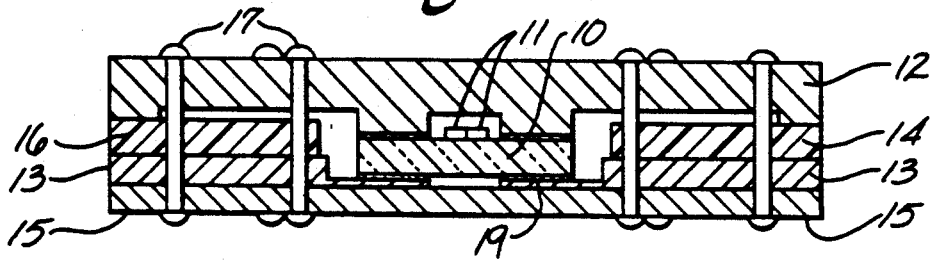
FIGS. 3a-3c illustrates three transverse cross-sections through the printhead of FIG. 1.

As illustrated in FIG. 1, the printhead for a light emitting diode (LED) printer is semi-schematic. The electrical connections are omitted since they are so numerous as to obscure other features in this scale of drawing. Mounting arrangements for fitting the printhead into the printer and lenses for imaging the LEDs on the photoreceptive surface of a printer are omitted since quite immaterial to an understanding of this invention.

The printhead has an elongated strip of glass 10 extending the full length of the printhead to form a transparent substrate on which LED dice 11 are mounted. The LED dice are mounted front face down on the glass substrate; that is, with the light emitting junction adjacent to the glass so that light is emitted through the transparent substrate.

The dice are placed in two rows extending along the length of the transparent substrate. Every other die 11a is in one row and the intervening dice 11b are in the other row. The first row of dice 11a is aligned so that the individual LEDs (not shown in FIGS. 1 and 2) are aligned to form a single line, albeit interrupted, of LEDs. Similarly the other row of dice 11b are aligned to form a single line of LEDs. The two lines are spaced apart from each other a distance slightly greater than the width of the LED dice.

When the LED printhead is used, the photoreceptive surface travels in a direction perpendicular to the lines of LEDs. To expose a single line on the photoreceptive surface, the LEDs in one row of dice are enabled. The second row of LED dice is enabled after an interval sufficient for the photoreceptive surface to have moved a distance corresponding to the distance between the row of LEDs on the two rows of dice.

There are a couple of reasons for mounting the dice staggered from each other in parallel rows. One is for purposes of alignment and the other is for electrical reasons. It has previously been difficult to properly position the dice along the length of the printhead. In a typical 300 pixel per inch printhead, the pitch of the LEDs is 84 micrometers. Exemplary LEDs are 62 micrometers wide and the separation between adjacent LEDs on the die is 22 micrometers. The ends of the die must be cut with sufficient precision relative to the end LED that the end LEDs on adjacent dice also have a separation of about 22 micrometers. Precise cutting is required as well as proper spacing of the adjacent dice.

By staggering the adjacent dice the ends do not need to be cut with great precision. There is no longer a problem of the end of one die interfering with the end of the adjacent die. Ample space may be left beyond the end LED on the die and the dice themselves may, in effect, overlap slightly. Alignment is achieved by properly spacing the LEDs rather than the perimeter of the dice.

Previously LED dice have been mounted on a metal substrate and the common cathode of the LEDs makes electrical connection to the substrate. An electrical lead is taken to each LED anode and each is controlled separately. It may be desirable to multiplex the LEDs in a printhead and such an arrangement is not suitable for multiplexing since the cathodes on all the dice are shorted together. Even if the dice are mounted on an insulating substrate, they may short together between the ends of adjacent dice. With the adjacent dice staggered from each other in separate rows, it becomes quite easy to provide electrical isolation. The dice approach each other only at the corners and by making the spacing between the rows a little more than the width of the dice, adequate space for reliable electrical isolation is provided.

Further, by inverting the dice as provided in practice of this invention, the common cathodes of the LEDs on one die can be electrically isolated from the common cathode on adjacent dice. This facilitates multiplexing.

Figure 3B:
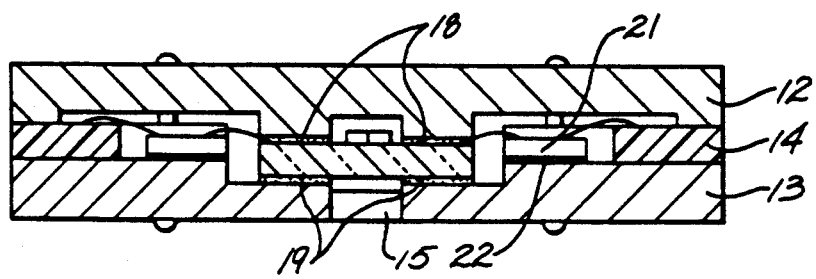
Figure 3C:
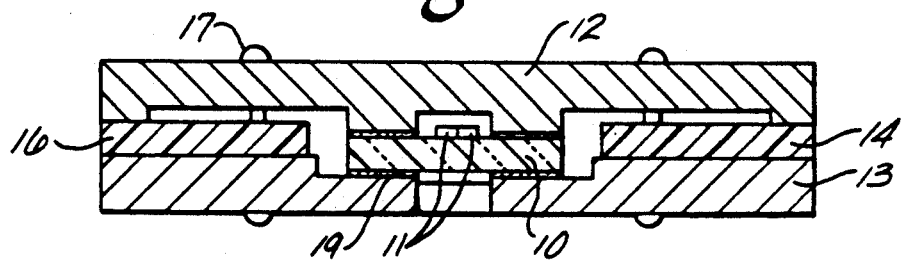

The glass strip 10 is sandwiched between an upper metal plate 12 (FIGS. 3a-3c and largely cut away in FIG. 1) and a pair of elongated lower metal plates 13. There is a gap between the lower metal plates extending the length of the printhead so that the glass strip is exposed for transmitting illumination from the LED dice 11 mounted on it. The parallel edges of the lower plates along the glass strip may be tapered to diverge for minimizing light reflections. Surfaces may also be blackened to minimize reflections. The parallel lower plates are secured together at the ends by cross pieces 15. The upper and lower plates are held apart by a printed circuit board 14 extending along one edge of the printhead, and a similar dummy board 16 along the opposite edge. Bolts 17 secure the assembly together. Spacers other than the printed circuit board may be used if desired.

Figure 4:
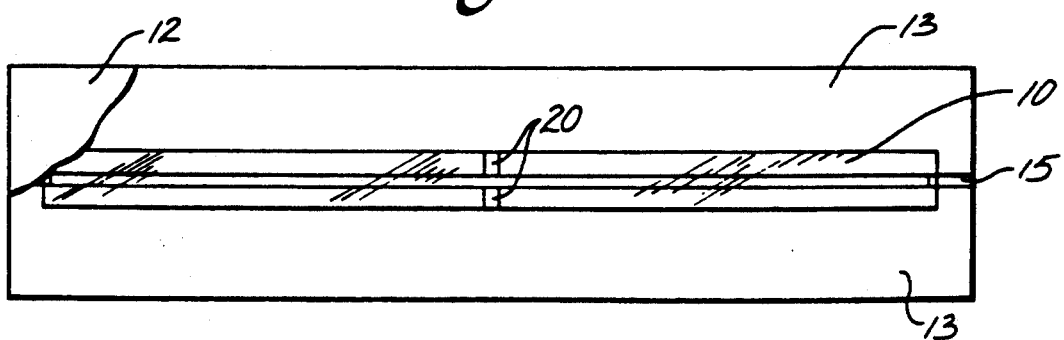
FIG. 4 is a face view of the printhead with an upper plate cut away and many details omitted illustrating attachment of a glass plate.

The glass strip is secured to the lower metal plates with narrow bands of adhesive 20 (FIG. 4) in the middle so that the ends of the glass strip can undergo thermal expansion independently of thermal expansion of the ends of the metal plates. The central single mounting minimizes thermal stresses due to temperature changes in the printhead, which may be appreciable. Compliant spacers 18 are fitted between the glass strip and the upper plate. A thermally conductive gel 19 is provided between the edges of the glass strip and the adjacent edges of the lower plates where these parts are not connected together for dissipating heat from the glass to the metal.

Heat dissipation from the glass to the metal is important to avoid overheating. There is a power dissipation of about 0.8 milliwatts per LED. Glass has a low thermal conductivity and it is desirable to have as short a heat transfer path through the glass to the metal as possible. Good thermal contact between the glass and metal is also of importance. When using GaAsP LEDs a temperature rise of up to 10° C. may occur. This can be reduced substantially by employing GaAlAs LEDs which have appreciably lower power dissipation.

In an exemplary embodiment an integrated circuit chip 21 is mounted on one of the lower plates between the printed circuit board and the rows of LED dice. A thin spacer 22 of molybdenum or the like is placed between the chip and plate for mediating between the low thermal expansion coefficient of the silicon chip and the high coefficient of the aluminum plate. Each integrated circuit chip controls LEDs on several dice. In an exemplary embodiment it may serve six dice with 48 LEDs per die, as illustrated in FIG. 2.

It will be apparent that alternative relationships may be employed between the integrated circuits and the LED dice. For example, IC chips may be placed on both sides of the row of dice with one group of ICs serving one row of dice and the other group of ICs serving the other row of dice. Alternatively IC chips on opposite sides of the row may be provided for electrical connection to alternate LEDs on a chip.

Electrical connections are made between the IC chips and LEDs by combinations of wire bonds and metal traces or lines deposited on the glass substrate. Conventional four step photolithography and deposition techniques may be used for placing the metal traces on the glass substrate.

In an example where 48 LEDs on each die are served by an IC chip, 48 parallel traces 23 extend along the glass substrate for the length of the group of LED dice served by the IC chip. Only a few of these lines are illustrated schematically in FIG. 2 because of the scale of the drawing. These traces may be only 40 micrometers wide and have spaces between them of only 20 micrometers.

Electrical connections are made between these longitudinal traces and the anodes of individual LEDs on the dice by deposited metal lines 24 perpendicular to the traces. A thin layer of silica insulation (not shown) or the like is provided between the longitudinal traces and transverse lines except where electrical connections are made therebetween.

Additional transverse lines 26 interconnect the longitudinal traces and a row of bonding pads 27. Conventional wire bonds 28 are made between the bonding pads and the IC chip.

Additional wire bonding pads 29 and interconnecting lead lines 31 are also formed on the glass substrate for making electrical connections between the IC chip and the cathodes of the LED dice. Conventional wire bonds 32 are made between the IC chip and such bonding pads. Additional wire bonds 33 are made between additional bonding pads 29 and the common cathode substrate of individual LED dice. Two sets of wire bonds are used since the connections between the glass substrate and the dice may be made at a different stage of assembly than the connections between the IC chips and the glass substrate.

The electrical connections described and illustrated are exemplary of those that may be used when there is multiplexing of IC power supplies for several LEDs. Other patterns of electrical connection are clearly feasible for other embodiments where multiplexing is not employed.

Figure 5:
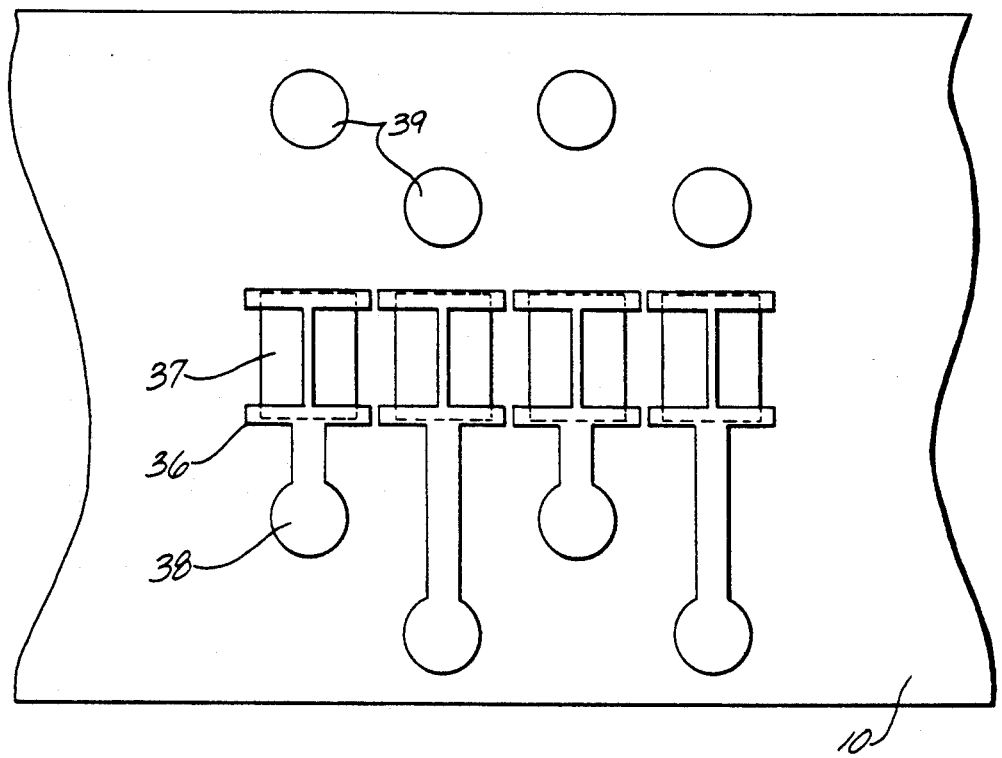
FIG. 5 is a fragmentary view of a face of an exemplary LED die.

Electrical connection is made on the LED dice as illustrated in FIG. 5. A generally H-shaped metal lead makes electrical contact with each LED 37. The lead is connected to a small bonding pad 38. This type of connection is conventional, except that previously wire bonds have been made to the connection pads 38. Symmetry is maintained by providing additional bonding areas 39 on the opposite side of the row of LEDs from the bonding pads 38.

As mentioned above, precise positioning of the LEDs on the dice is important in a printhead. The electrical connections to the LEDs are used for making such precise positioning. This is feasible since the electrical lead lines on the glass substrate and LED dice can be precisely located by photolithography. Modern lithography allows better than two micrometer resolution over distances of as much as ten centimeters and better resolution over short distances.

A thin insulating layer 41 of silica or the like is deposited over the metal electrical connection layer 42 on the glass substrate 10. Precisely located apertures are provided through the insulation so that the underlying metal is exposed. A thin "bump" of solder is then plated in the aperture. Similarly, a layer of insulation 43 is deposited on the metal bonding pads 38 on the LED die, leaving an aperture in a precisely known location relative to the LEDs.

The LED die is then placed on the substrate with the apertures in the insulation approximately aligned with the solder bumps on the glass substrate. When the solder is melted it wets the metal through the aperture in the insulation on the LED die. This, of course, makes electrical contact between the leads on the glass and those on the die. It also serves to secure the die onto the glass.

Solder bumps have been used for making electrical contact and securing integrated circuit chips to printed circuit boards and the like in what is sometimes referred to a flip chip assembly. Precise location of such integrated circuit chips is not usually of concern.

Figure 6:
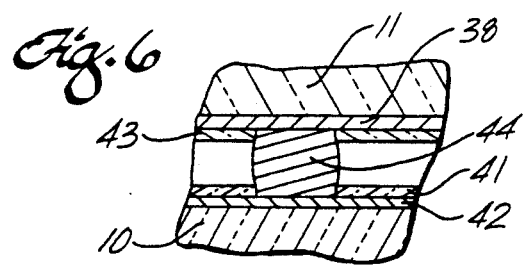
FIG. 6 is a fragmentary transverse cross section adjacent of a solder bump connecting an LED die to a substrate.

More significantly, in the case of LEDs where the location of the light beam is important, the beads of solder 44 (FIG. 6) formed when the solder bumps are melted position the LED dice on the substrate with considerable precision. If a solder bump is not perfectly aligned with the pad to which it is being connected, the surface tension of the molten solder seeks to achieve a minimum energy state. This effect applies a lateral force in a direction such that the die is pulled into proper alignment with the wetted area on the glass substrate. The beads of solder 44 essentially form cylinders between the exposed metal in the insulation aperture on the substrate and the exposed metal in the insulation aperture on the LED die. Since these apertures can be precisely located by photolithography, the die is precisely positioned on the substrate.

It will be noted that with this alignment technique of LEDs inverted on a transparent substrate, the LEDs lie in a plane independent of the thickness of the LED dice. The light emitting junction is at a distance above the glass surface defined by the thickness of the solder bumps. Typical solder bump thickness is in the order of ten micrometers with a thickness variation in the order of one micrometer. Thus, the position of the LEDs is within a micrometer or so of being in a single plane throughout the length of the printhead. When the apertures in the insulation, and hence the diameter of the solder bumps, is in the order of fifty micrometers, alignment accuracy in the lateral direction of as little as plus or minus ten micrometers should result. Smaller apertures improve the precision of placement.

Figure 7:
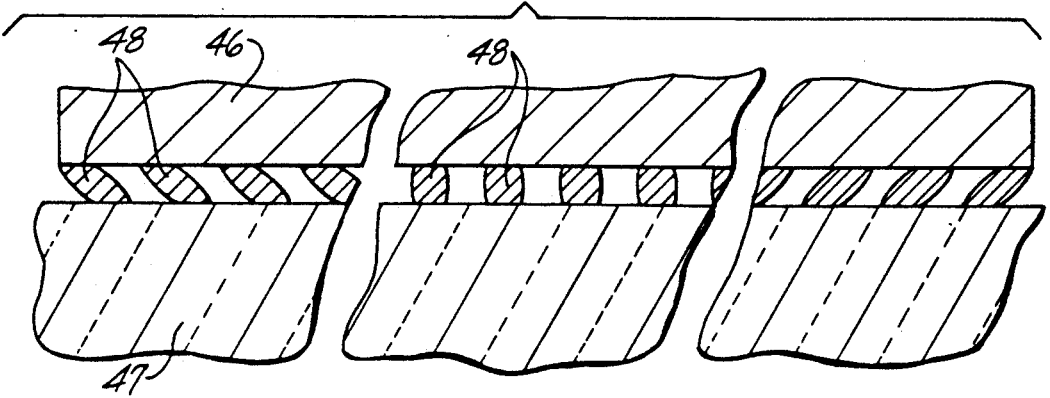
FIG. 7 illustrates in transverse cross section an embodiment where the bonding pads for solder bumps have slightly different pitch.

LED placement precision may be enhanced by an additional improvement as illustrated in FIG. 7. In such an embodiment there is a slight mismatch in the pitch between bonding areas on the LED die 46 and the solder bump apertures on the glass substrate 47. For example, when the difference in pitch is only 0.2 micrometers, there is a length difference of 19.2 micrometers over the length of an LED die with 96 LEDs.

In such an embodiment if the left-most solder bump 48 were aligned perfectly with its bonding area on the LED die, then the right-most solder bump is misaligned by 19.2 micrometers. This misalignment at one end of the LED die results in a larger force pushing the chip to the left until the left and right end solder bumps are equally misaligned; that is, until the LED die is perfectly centered. Such an alignment technique works well although the force generated by an individual solder bump may be small since each LED die has a large number of solder bumps. To enhance this force solder bumps are provided between the glass substrate and the dummy areas 39 (FIG. 5) as well as the active electrical bonding areas 38.

Figure 8:
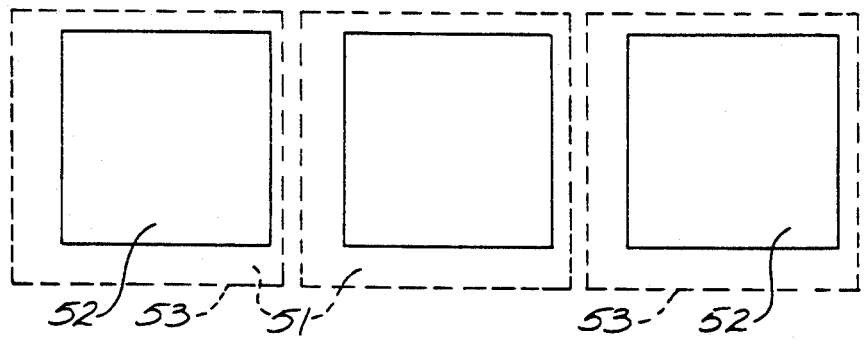
FIG. 8 is a fragmentary face view of a masked glass substrate for a printhead.

The accuracy of positioning of an LED die by utilizing the surface tension of solder bumps depends in part on the size of the solder bumps, smaller solder bumps giving closer alignment. In the event a particular design of solder bumps does not produce the desired precision of location, an arrangement as illustrated in FIG. 8 may be employed. In this embodiment an opaque layer 51 is deposited on the transparent substrate leaving a row of rectangular transparent windows 52 corresponding to the row of LEDs on a die. The opaque layer is conveniently an area of metal deposited with the metal leads or traces for making electrical contact. The metal layer adjacent to the LEDs is insulated from the LEDs.

The LED dice are placed on the substrate with the LEDs 53 behind the windows. The windows are made smaller than the LEDs 53 behind the windows. If a window is 62 micrometers square and an LED is 80 micrometers square for example, the window would completely compensate for a misalignment of the LED die up to plus or minus nine micrometers. Thus, position of the areas illuminated by the LEDs is determined by photolithography of the masking opaque layer on the glass rather than the position of the LED dice.

The penalty for an arrangement with an LED larger glass the window is the additional dissipation from the larger area LED. This may be an affordable penalty where is substantially reduces difficulties of assembly. All it means is that additional heat need be dissipated, or use of lower power dissipation LEDs such as those made out of GaAlAs.

Figure 9:
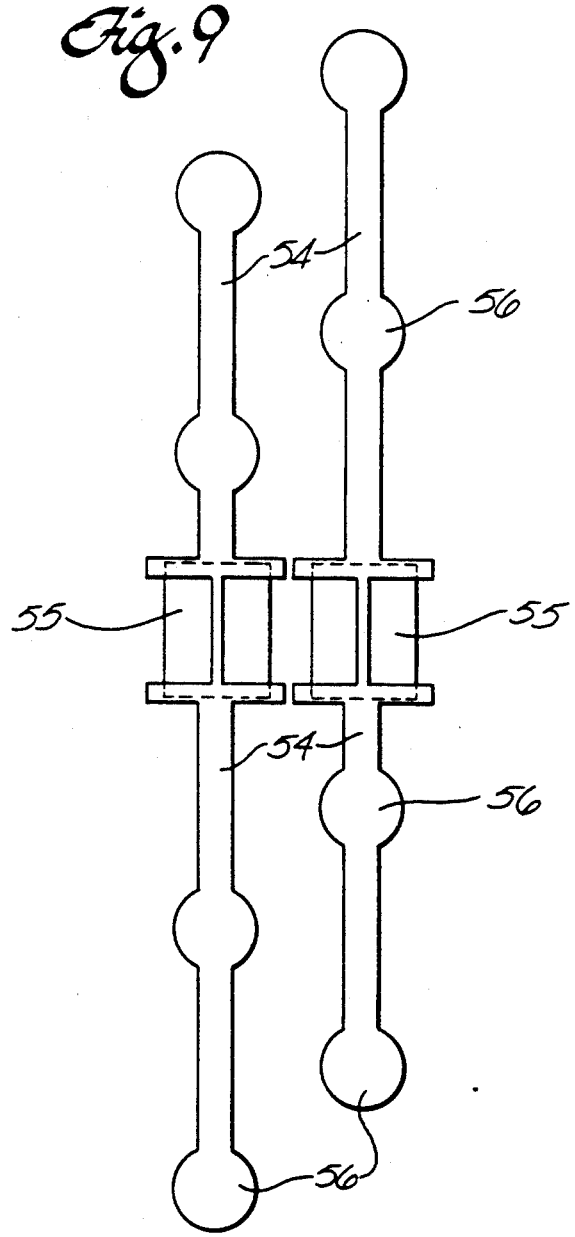
FIG. 9 is a fragmentary face view of another embodiment of LED die for use in practice of this invention.

FIG. 9 illustrates another arrangement for the electrical leads 54 on the LED die for making electrical connection to the individual LEDs 55. In this embodiment symmetry is maintained by providing electrical leads on both sides of the row of LEDs. By having asymmetrical arrangement of electrical leads, orientation of the LED dice becomes immaterail.

Further, each electrical lead has two bonding areas 56 to which solder bumps may be connected. By having two solder bumps on each electrical lead a measure of redundancy is provided for enhancing lead a measure of occasional solder bump does not make good electrical contact. Increasing the number of solder bumps also increases the positioning force on the LED die, tending to improve positioning by surface tension forces.

FIG. 10 illustrates still another arrangement for the electrical leads 57 on the LED die for making electrical connection to the individual LEDs 58. In this embodiment symmetry is maintained by providing electrical leads on alternating sides of the LEDs along the row. Each electrical lead is forked to extend to two bonding areas 59 to which solder bumps may be connected. The two solder bumps on each electrical lead provide redundancy.

Although glass makes a desirable transparent substrate for the inverted LED dice since it is inexpensive and easily made in large pieces with a very flat surface, other materials may be employed to take advantage of their high thermal conductivity for dissipating heat from the LEDs. Other suitable materials include sintered aluminum oxide with a thermal conductivity of 0.35 W/cm° C. or spinel with a thermal conductivity of 0.13. Fused quartz with a thermal conductivity of 0.014 may be used although its thermal conductivity is not much higher than that of glass (0.011).

Various structural modifications may be made collateral to use of the transparent substrate. For example, there are various arrangements of circuits boards, integrated circuit chips and the like which may be used to provide power and signals to the LEDs. Instead of a pair of lower plates secured together at the end, a single lower plate with a slot along its length may be used. Additional means may be provided for dissipating heat from the LEDs and the like. Instead of using a thermally conductive gel between the glass substrate and the metal for dissipating heat, a liquid, paste or similar or semi-fluid medium which will not apply stresses to the substrate may be used.

Many other modifications and variations will be apparent to those skilled in the art. It is therefore to be understood that within the scope of the appended claim the invention may be practiced otherwise than as specifically described.

What is claimed is:

1. A light emitting diode printhead comprising:
a transparent substrate;
a plurality of light emitting diode dice mounted in a row on the substrate, each die comprising a row of light emitting diodes on the face of the die having their light emitting junctions adjacent to the substrate for emitting light through the substrate, each diode on a die having a separate anode, the cathodes of the diodes on each die being interconnected in a cathode portion of the die;
metal pads on the dice for making electrical connection to the anode of each light emitting diode;
electrically conductive lines on the substrate for making electrical connections to the anodes of light emitting diodes on the dice;
means for making electrical connection between the conductive lines and respective pads; and
means for making electrical connection to the cathode portion of each light emitting diode die; and wherein
the row of light emitting diode dice comprises a pair of parallel rows of light emitting diode dice spaced apart more than the width of the light emitting diodes, adjacent dice being offset from each other and alternating between rows so as to be electrically isolated from each other.

2. A light emitting diode printhead comprising:

a transparent substrate;

a plurality of light emitting diode dice mounted in a row on the substrate, each die comprising a row of light emitting diodes on the face of the die having their light emitting junctions adjacent to the substrate for emitting light through the substrate, each diode on a die having a separate anode, the cathodes of the diodes on each die being interconnected in a cathode portion of the die;

metal pads on the dice for making electrical connection to the anode of each light emitting diode;

electrically conductive lines on the substrate for making electrical connections to the anodes of light emitting diodes on the dice;

means for making electrical connection between the conductive lines and respective pads;

means for making electrical connection to the cathode portion of each light emitting diode die; and an opaque layer on the substrate having a row of windows, each window being adjacent to a light emitting diode on a die, the width of each window being smaller than the width of the light emitting diode behind the window.

3. A light emitting diode printhead comprising:

a transparent substrate;

a plurality of light emitting diode dice mounted in a row on the substrate, each die comprising a row of light emitting diodes on the face of the die having their light emitting junctions adjacent to the substrate for emitting light through the substrate, each diode on a die having a separate anode, the cathodes of the diodes on each die being interconnected in a cathode portion of the die;

metal pads on the dice for making electrical connection to the anode of each light emitting diode;

electrically conductive lines on the substrate for making electrical connections to the anodes of light emitting diodes on the dice;

means for making electrical connection between the conductive lines and respective pads, said means including solder bumps having sufficiently small dimensions that surface tension of the solder positions the respective dice relative to the conductive lines, and means for making electrical connection to the cathode portion of each light emitting diode die; wherein the means for making electrical connection also secures the dice to the substrate.

4. A light emitting diode printhead comprising:

a transparent substrate;

a plurality of metal lines deposited on the substrate for making electrical connections;

a plurality of LED dice mounted in a row on the substrate, each die comprising a row of LEDs on the face of the die having their light emitting junctions adjacent to the substrate for emitting light through the substrate;

an electrical connection pad in a known location on the die for each LED; and a plurality of solder bumps in known locations for interconnecting each pad and a metal line; and wherein successive dice are sufficiently staggered from each other along the length of the row to avoid electrical contact between adjacent dice.

5. A light emitting diode printhead comprising:

a transparent substrate;

a plurality of metal lines deposited on the substrate for making electrical connections;

a plurality of LED dice mounted in a row on the substrate, each die comprising a row of LEDs on the face of the die having their light emitting junctions adjacent to the substrate for emitting light through the substrate;

an electrical connection pad in a known location on the die for each LED; and a plurality of solder bumps in known locations for interconnecting each pad and a metal line; and wherein the pitch of the metal lines is different from the pitch of the connection pads along the length of the row.

6. A light emitting diode printhead comprising:

a transparent substrate;

a plurality of metal lines deposited on the substrate for making electrical connections;

a plurality of LED dice mounted in a row on the substrate, each die comprising a row of LEDs on the face of the die having their light emitting junctions adjacent to the substrate for emitting light through the substrate;

an electrical connection pad in a known location on the die for each LED;

a plurality of solder bumps in known locations for interconnecting each pad and a metal line;

an opaque layer on the transparent substrate; and a row of windows in the opaque layer, each window corresponding to one LED on a die, wherein the window is smaller than the LED for masking edge portions of the LED.

7. A light emitting diode printhead comprising:

a transparent substrate;

a plurality of light emitting diode dice mounted in a row on the substrate, each die comprising a row of light emitting diodes on the face of the die having their light emitting junctions adjacent to the substrate for emitting light through the substrate, each diode on a die having a separate anode, the cathodes of the diodes on each die being interconnected in a cathode portion of the die;

metal pads on the dice for making electrical connection to the anode of each light emitting diode;

electrically conductive lines on the substrate for making electrical connections to the anodes of light emitting diodes on the dice;

means for making electrical connection between the conductive lines and respective pads;

means for making electrical connection to the cathode portion of each light emitting diode die; wherein the means for making electrical connection also secures the dice to the substrate; and a plurality of dummy pads on each die, a plurality of dummy pads on the substrate and a plurality of solder bumps interconnecting the dummy pads on the dice with dummy pads on the substrate.

8. A light emitting diode printhead comprising:

a transparent substrate;

a plurality of elongated LED dice mounted on the substrate, each LED die comprising a row of LEDs along the length of the die, the LED dice being mounted on the substrate with the light emitting junction of the LEDs adjacent to the substrate so that light is emitted through the substrate;

an opaque layer on at least a portion of the substrate; and a row of windows corresponding to the LEDs on a die, each window having a dimension less than the dimension of the corresponding LED for masking edge portions of the LEDs.

9. A light emitting diode printhead comprising:
an elongated substrate; and
a plurality of elongated LED dice mounted on the substrate, each LED die comprising a row of LEDs along the length of the die, the LED dice being arranged in:
a first row of LED dice along the length of the substrate; and
a second row of LED dice along the length of the substrate parallel to the first row and spaced from the first row more than the width of a die, the dice in each row being spaced apart from each other approximately the length of a die, the dice in the second row being staggered from the dice in the first row for preventing electrical contact between adjacent dice.

10. A light emitting diode printhead as recited in claim 9 wherein the substrate is transparent and the LED dice are mounted on the substrate with the light emitting junctions of the LEDs adjacent to the substrate so that light is emitted through the substrate.

11. A light emitting diode printhead comprising:
a lower metal plate having a slot along its length;
an upper metal plate;
an elongated transparent substrate sandwiched between the upper and lower metal plates over the slot;
a plurality of LED chips arrayed along the transparent substrate for illumination through the substrate and slot;
means for securing the transparent substrate to one of the metal plates only in a center portion of the substrate; and
a thermally conductive liquid or semi-fluid medium between the transparent substrate and at least one of the metal plates.

12. A light emitting diode printhead as recited in claim 11 herein the transparent substrate is secured to the metal plate by an adhesive.

13. A light emitting diode printhead as recited in claim 12 wherein the transparent substrate is secured to the lower plate on each side of the slot.

14. A light emitting diode printhead as recited in claim 11 the transparent substrate is secured to the lower plate on each side of the slot.

15. A method for positioning an LED die on a transparent substrate comprising the steps of:
forming a row of connection pads at known locations on a substrate;
forming a row of connection pads at known locations on the emitting junction face of an LED die having a row of LEDs along the die, the connection pads on the die having a pitch different from the pitch of the connection pads on the substrate;
plating solder on at least some of the connection pads;
positioning the LED die with its connection pads adjacent to the connection pads on the substrate; and
melting the solder for wetting the adjacent connection pads.

16. A method for positioning an LED die on a transparent substrate comprising the steps of:

forming a row of connection pads at known locations on the emitting junction face of an LED die having a row of LEDs along the die;
plating solder on at least some of the connection pads;
positioning the LED die with its connection pads adjacent to the connection pads on the substrate; and
melting the solder for wetting the adjacent connection pads, wherein the rows of connection pads form an electrical connection;
forming a plurality of dummy pads on the die and a plurality of corresponding dummy pads on the substrate;
plating solder on at least some of the dummy pads; and
melting the solder for wetting the dummy pads.

17. A light emitting diode printhead comprising:
a transparent substrate;
a plurality of light emitting diode dice mounted in a row on the substrate, each die comprising a row of light emitting diodes on the face of the die having their light emitting junctions adjacent to the substrate for emitting light through the substrate, each diode on a die having a separate anode, the cathodes of the diodes on each die being interconnected in a cathode portion of the die;
metal pads on the dice for making electrical connection to the anode of each light emitting diode;
electrically conductive lines on the substrate for making electrical connections to the anodes of light emitting diodes on the dice;
means for making electrical connection between the conductive lines and respective pads; and
means for making electrical connection to the cathode portion of each light emitting diode die; and wherein
the row of light emitting diode dice comprises a pair of parallel rows of light emitting diode dice spaced apart more than the width of the light emitting diodes, adjacent dice being offset from each other and alternating between rows so as to be electrically isolated from each other.

18. A light emitting diode printhead comprising:
a transparent substrate;
a plurality of light emitting diode dice mounted in a row on the substrate, each die comprising a row of light emitting diodes on the face of the die having their light emitting junctions adjacent to the substrate for emitting light through the substrate, each diode on a die having a separate anode, the cathodes of the diodes on each die being interconnected in a cathode portion of the die;
metal pads on the dice for making electrical connection to the anode of each light emitting diode;
electrically conductive lines on the substrate for making electrical connections to the anodes of light emitting diodes on the dice;
means for making electrical connection between the conductive lines and respective pads; and
means for making electrical connection to the cathode portion of each light emitting diode die; and
an opaque layer on the substrate having a row of windows, each window being adjacent to a light emitting diode on a die, the width of each window being smaller than the width of the light emitting diode behind the window.

* * * * *